(12) United States Patent
Yun

(10) Patent No.: US 7,666,705 B2
(45) Date of Patent: Feb. 23, 2010

(54) IMAGE SENSOR AND METHOD OF MANUFACTURING THE SAME

(75) Inventor: Young Je Yun, Yongin-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 6 days.

(21) Appl. No.: 12/112,755

(22) Filed: Apr. 30, 2008

(65) Prior Publication Data

US 2008/0272416 A1 Nov. 6, 2008

(30) Foreign Application Priority Data

May 3, 2007 (KR) .................. 10-2007-0042911

(51) Int. Cl.
*H01L 21/00* (2006.01)
(52) U.S. Cl. .............. 438/69; 438/70; 438/71; 438/72; 257/E31.127
(58) Field of Classification Search ............ 438/69, 438/70, 71, 72, 27, 31, 32, 200; 257/E31.127, 257/432, 290–292, 333
See application file for complete search history.

(56) References Cited

U.S. PATENT DOCUMENTS 4,694,185 A * 9/1987 Weiss ................. 250/208.1

2007/0276972 A1 * 11/2007 Kikuchi et al. .............. 710/104

FOREIGN PATENT DOCUMENTS

KR 10-1998-0061089 7/2000
KR 10-2004-0115874 7/2006

* cited by examiner

*Primary Examiner*—Davienne Monbleau
*Assistant Examiner*—Shweta Mulcare
(74) *Attorney, Agent, or Firm*—Saliwanchik, Lloyd & Saliwanchik

(57) ABSTRACT

Provided is an image sensor and method of manufacturing the same. The image sensor can include a semiconductor substrate, a metal interconnection layer, an inorganic layer, lens seed patterns, and microlenses. The semiconductor substrate can include unit pixels. The metal interconnection layer can be disposed on the semiconductor substrate to provide signal and poser connections to the unit pixels. The inorganic layer can be disposed on the metal interconnection layer. The lens seed patterns are selectively disposed on the inorganic layer and are formed of an organic material. The microlenses are formed on the lens seed patterns.

9 Claims, 3 Drawing Sheets

IMAGE SENSOR AND METHOD OF MANUFACTURING THE SAME

CROSS-REFERENCE TO RELATED APPLICATIONS

The present application claims the benefit under 35 U.S.C. §119 of Korean Patent Application No. 10-2007-0042911, filed May 3, 2007, which is hereby incorporated by reference in its entirety.

BACKGROUND

In general, an image sensor is a semiconductor device that converts an optical image into an electrical signal. The image sensor is typically classified as a charge coupled device (CCD) image sensor or a complementary metal oxide semiconductor (CMOS) image sensor (CIS).

A unit pixel of such a CIS includes a photodiode and a metal oxide semiconductor (MOS) transistor. In operation, the CIS sequentially detects an electrical signal of the unit pixel in a switching manner to generate an image.

To improve optical sensitivity of the CIS, microlenses are used to condense light towards the photodiodes. Color filters are also included in certain CIS to produce a color image.

The color filters and the microlenses are formed on a pixel array substrate including pixels.

The microlenses are formed in a dome shape by sequentially performing an exposure process, a development process, and a reflow process to a photosensitive organic material.

In the case where the microlenses are formed through a single patterning process followed by a reflow process, adjacent microlenses may have gaps therebetween. Here, light passing through the gaps may be detected by a non-corresponding photodiode disposed on the pixel array substrate, which produces noise and crosstalk.

The gaps form between microlenses when wide areas between the microlenses in the patterning process for the microlenses are not sufficiently reduced in the reflow process.

As a matter of course, the gaps can be reduced in the reflow process. However, an excessive reflow process causes adjacent microlenses to merge with each other, which results in a bridge and merging of microlenses.

BRIEF SUMMARY

Embodiments of the present invention provide an image sensor and a method of manufacturing the image sensor that can minimize the gap between microlenses and inhibit a bridge from forming during a reflow process.

In one embodiment, an image sensor includes: a semiconductor substrate including unit pixels; a metal interconnection layer on the semiconductor substrate; an inorganic layer on the metal interconnection layer; lens seed patterns selectively disposed on the inorganic layer, the lens seed patterns being formed of an organic material; and microlenses on the lens seed patterns.

In another embodiment, a method of manufacturing an image sensor includes: forming a metal interconnection layer on a semiconductor substrate including unit pixels; forming an inorganic layer on the metal interconnection layer; forming lens seed patterns formed of an organic material on the inorganic layer; and forming microlenses on the lens seed patterns.

The details of one or more embodiments are set forth in the accompanying drawings and the description below. Other features will be apparent from the description and drawings, and from the claims.

DETAILED DESCRIPTION

Reference will now be made in detail to embodiments of the present disclosure, examples of which are illustrated in the accompanying drawings.

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Figure 6:
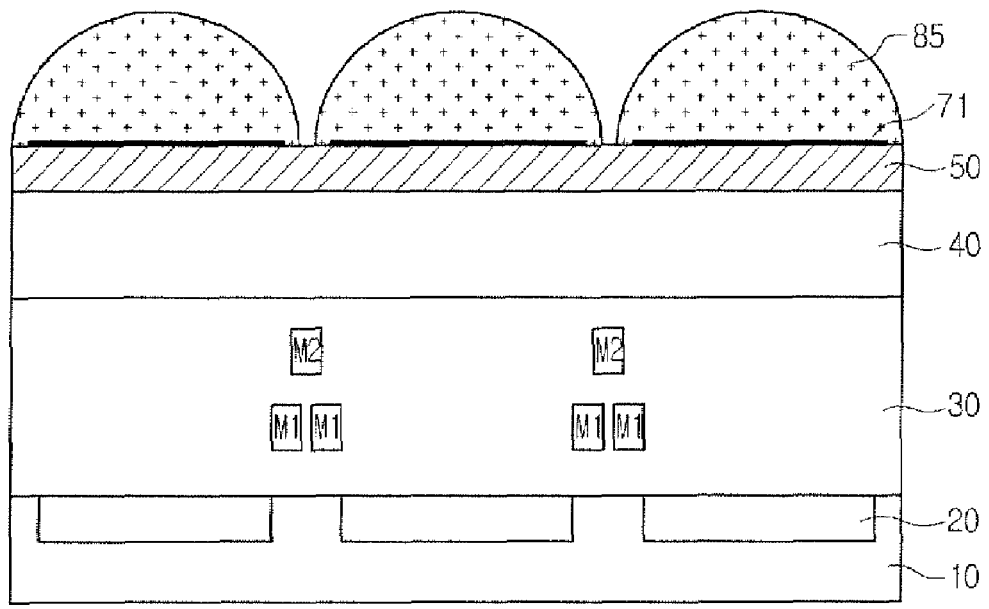

FIG. 6 is a cross-sectional view illustrating an image sensor according to an embodiment.

Referring to FIG. 6, an image sensor can include a semiconductor substrate 10 including unit pixels, a metal interconnection layer 30 on the semiconductor substrate 10, an inorganic layer 50 on the metal interconnection layer 30, lens seed patterns 71 selectively disposed on the inorganic layer 50, and microlenses 85 on the lens seed patterns 71.

The lens seed patterns 71 can include an organic material such as a thermal resin, and the microlenses 85 can include an organic material similar to that of the lens seed patterns 71. Each of the microlenses 85 can be disposed on each of the lens seed patterns 71.

The lens seed patterns 71 are spaced apart from each other on the inorganic layer 50 such that each of the lens seed patterns 71 corresponds to one of the unit pixels. The spaced apart lens seed patterns 71 inhibit the microlenses 85 adjacent to each other from merging with each other.

The inorganic layer 50 can include a hydrophilic oxide layer. For example, the inorganic layer 50 can be a d-tetraethyl orthosilicate (d-TEOS) layer or a low temperature oxide (LTO) layer. The inorganic layer 50 can be formed of the hydrophilic oxide layer to inhibit the microlenses 85 from extending in a reflow process.

Thus, the microlenses 85 adjacent to each other can maintain the minimum gap between the microlenses and inhibit a bridge from forming, thereby improving the quality of the image sensor.

In further embodiments, a passivation layer 40 can be disposed on the metal interconnection layer 30 to protect lower devices.

Hereinafter, a process of manufacturing an image sensor according to an embodiment will be described.

Figure 1:
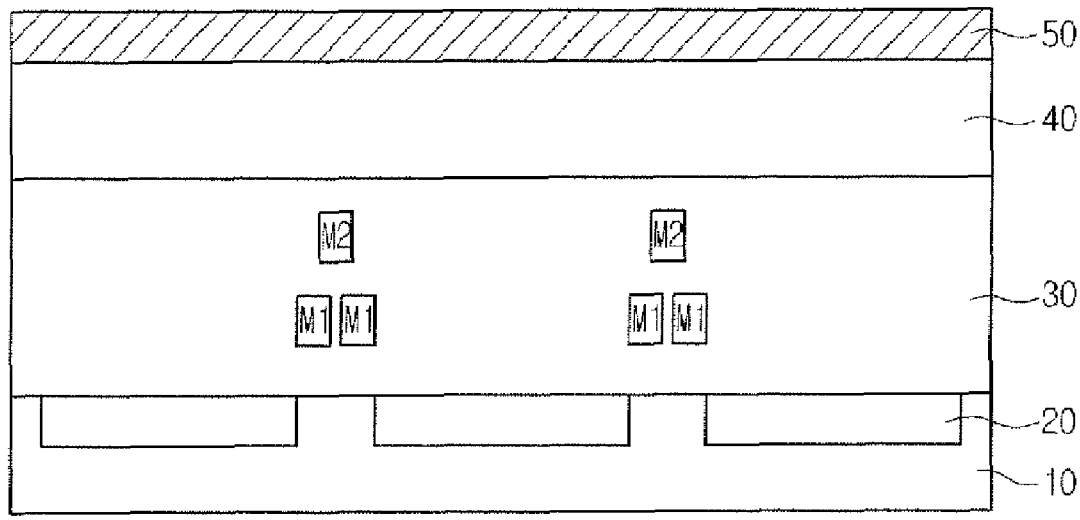
FIGS. 1 to 6 are cross-sectional views illustrating a process of manufacturing an image sensor according to an embodiment.

Referring to FIG. 1, a metal interconnection layer 30 can be formed on a semiconductor substrate 10.

The semiconductor substrate 10 can include a pixel region having light-sensing devices 20 and a peripheral circuit region (not shown).

Each of the light-sensing devices 20 can be formed as each of the unit pixels. Each of the light-sensing devices 20 can include a photodiode receiving light to generate a photo-charge and a complimentary metal oxide semiconductor (CMOS) circuit (not shown) connected to the photodiode to convert the received photo-charge into an electric signal.

In certain embodiments, the photodiode of the light-sensing device 20 can be a photodiode having a typical p/n/p structure.

In another embodiment, the photodiode of the light-sensing device 20 can include a red-wavelength photodiode, a green-wavelength photodiode, and a blue-wavelength photodiode.

In the case where the photodiode of the light-sensing device 20 includes the red-, green-, and blue-wavelength photodiodes, the red-, green-, and blue-wavelength photodiodes are vertically arranged in the substrate of each pixel, so as to obtain a high quality image. The photodiode including the red-, green-, and blue-wavelength photodiodes can be used to reproduce various colors without color filters.

After devices including the light-sensing device 20 are formed on the substrate, a metal interconnection layer 30 can be formed on the semiconductor substrate 10.

The metal interconnection layer 30 includes an interlayer dielectric and a plurality of metal interconnections (M1 and M2) passing through the interlayer dielectric. In an embodiment, the interlayer dielectric can include an oxide layer, and the metal interconnections M1 and M2 can be formed of various conductive materials including metal, alloy, or silicide.

The interlayer dielectric including the metal interconnections M1 and M2 can be provided in the form of a plurality of layers. Although the figures show two metal layers (M1 and M2) of metal interconnections, embodiments are not limited thereto. For example, three metal layers can be used to provide the metal interconnections.

In many embodiments, the metal interconnections M1 and M2 can be intentionally arranged not to block light incident to the photodiode.

The passivation layer 40 can be formed on the metal interconnection layer 30.

The passivation layer 40 is designed for protecting a device from humidity or scratch, and may be a dielectric.

The passivation layer 40 can include a silicon oxide layer, a silicon nitride layer, a silicon oxynitride layer, or have one or more layers that are stacked. Of course, the passivation layer 40 can be omitted.

Although not shown, a color filter layer and a planarization layer can be formed on the passivation layer 40.

In the below described embodiment, the color filter layer and the planarization layer are not provided.

In the case where the passivation layer 40, the color filter layer, and the planarization layer are omitted, a height of the image sensor can be reduced, so that a thinner image sensor can be obtained and the number of processes and manufacturing costs can be reduced.

In an embodiment, the inorganic layer 50 can be formed on the passivation layer 40.

The inorganic layer 50 is Conned by depositing a hydrophilic inorganic material on the passivation layer 40 using, for example, chemical vapor deposition (CVD). In one embodiment, the inorganic layer 50 can be formed by depositing a hydrophilic oxide layer to a thickness of about 50 Å to 1,000 Å using plasma enhanced chemical vapor deposition (PECVD). In certain embodiments, the hydrophilic oxide layer can be a d-TEOS layer or an LTO layer.

Figure 2:
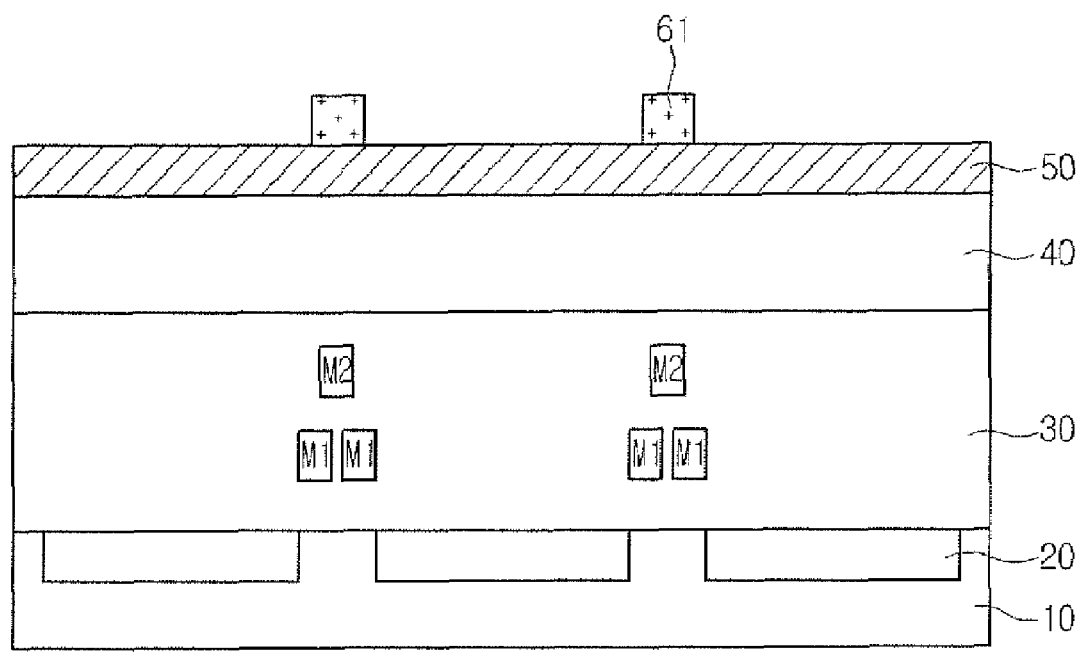

Referring to FIG. 2, gap patterns 61 can be formed on the inorganic layer 50.

The gap patterns 61 are designed for defining the gap regions of the microlenses 85 and can be formed using a photomask (not shown) having an opposite shape to that of a photomask (not shown) for microlenses.

That is, the inorganic layer 50 can be coated with a photoresist using a spin process, and then the photoresist can be patterned into gap patterns 61 by exposing and developing the photoresist using a photomask having the opposite pattern to the microlens photomask.

Accordingly, the gap patterns 61 are formed on a region of the inorganic layer 50 corresponding to the gap region of the microlenses 85.

Figure 3:
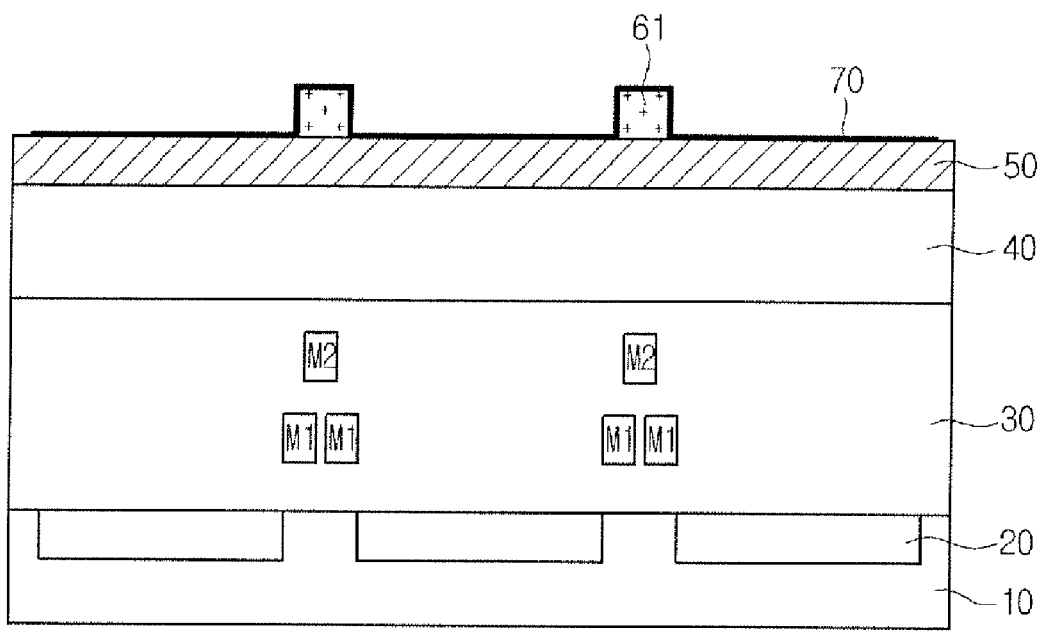

Referring to FIG. 3, a lens seed layer 70 can be formed on the inorganic layer 50 on which the gap patterns 61 are formed.

The lens seed layer 70 can be formed by coating the inorganic layer 50 having the gap patterns 61 with a hydrophobic organic material and performing a beat treatment process. In an embodiment, the lens seed layer 70 can be formed of a thermal resin (TR). The lens seed layer 70 can be formed in a thin film shape by performing the coating up to a thickness of about 10 nm to 1,000 nm and immediately performing a development process with a developer.

Since the lens seed layer 70 is cured using the heat treatment process, the lens seed layer 70 is formed in a thin film shape on the gap patterns 61 and the inorganic layer 50.

Figure 4:
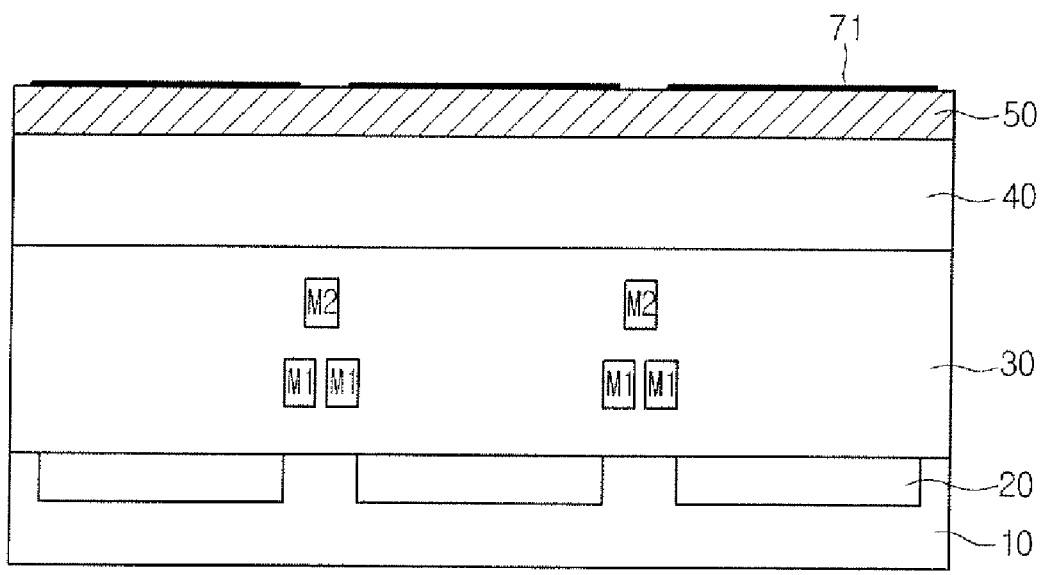

Referring to FIG. 4, the lens seed patterns 71 are selectively formed on the inorganic layer 50.

The lens seed patterns 71 are formed by simultaneously removing the gap patterns 61 and the lens seed layer 70 formed on the gap patterns 61.

In an embodiment, the gap patterns 61 and the lens seed layer 70 formed on the gap patterns 61 can be removed by applying a thinner, or solvent, on the inorganic layer 50 and cleaning the inorganic layer 50. In a specific embodiment, the applied thinner can include a mixture of propylene glycol monomethyl ether (PGME) and propylene glycol monomethyl ether acetate (PGMEA).

When the thinner is applied on the inorganic layer 50, the thinner permeates into the gap patterns 61 obtained from the photoresist to dissolve the material forming the photoresist, thereby removing the gap patterns 61 and simultaneously removing the lens seed layer 70 on the gap patterns 61.

At this point, since the lens seed layer 70 on the inorganic layer 50 has been cured, the lens seed layer 70 is not removed by the thinner but remains on the inorganic layer 50.

Thus, the lens seed patterns 71 are selectively formed on the inorganic layer 50, while an upper portion of the inorganic layer 50 corresponding to the gap patterns 61 is exposed by the removal of the gap patterns 61.

The lens seed patterns 71 are selectively formed on only regions of the inorganic layer 50 on which the microlenses 85 are to be formed. Regions of the inorganic layer 50 corresponding to the locations of gaps between the microlenses are exposed, so that a bridge and a merge of the microlenses 85 can be inhibited from occurring.

Also, since the lens seed patterns 71 are formed in a thin film shape, the lens seed patterns 71 have a negligible effect on the overall thickness of the image sensor.

Figure 5:
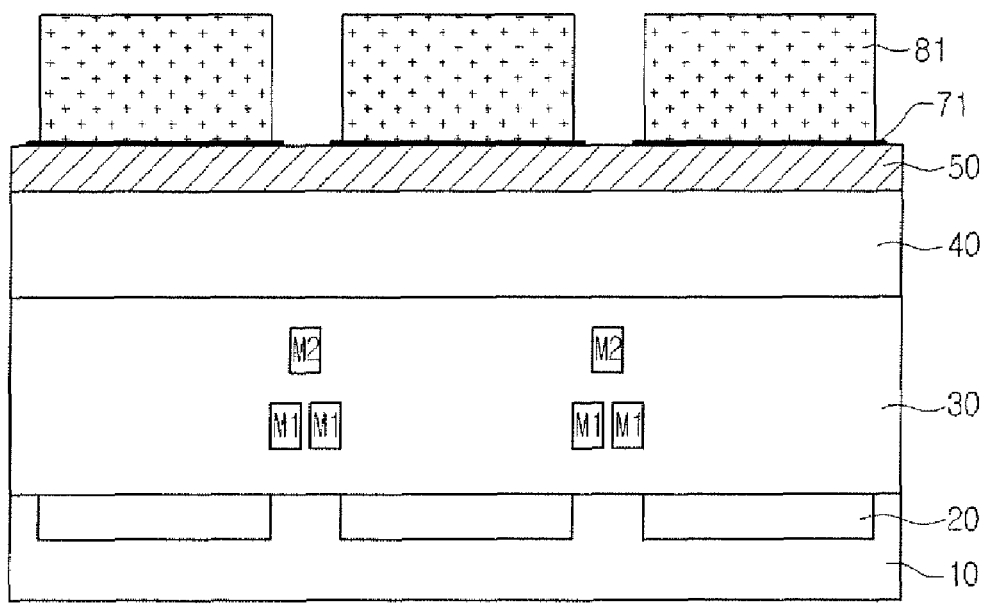

Referring to FIG. 5, microlens patterns 81 can be formed on only the lens seed patterns 71.

According to an embodiment, the microlens patterns 81 are formed by coating the inorganic layer 50 including the lens seed patterns 71 with a photoresist using a spin process, and performing exposure and development processes using the photomask for microlenses.

The microlens patterns 81 can be formed on only the lens seed patterns 71 because the photomask having an opposite shape to that of the gap patterns 61 is used.

Referring to FIG. 6, the microlenses 85 can be formed on the inorganic layer 50 using the microlens patterns 81.

The dome-shaped microlenses 85 can be obtained by performing a reflow process. By forming the microlenses 85 on the lens seed patterns 71, adjacent microlenses 85 can be formed to have the minimum gaps between them.

The minimum gaps can be formed because the microlens patterns 81 and the lens seed patterns 71 are formed of hydrophobic organic materials, and the inorganic layer 50 between the lens seed patterns 71 is formed of hydrophilic inorganic material.

That is, since the microlens patterns 81 are formed on the lens seed patterns 71, which are formed of the similar organic materials, in the reflow process for the microlens patterns 81, the microlenses 85 easily reflow on the lens seed patterns 71, but do not easily reflow on the inorganic layer 50 because of a low reflow ratio.

Thus, when the reflow process is performed on the microlens patterns 81 on the lens seed patterns 71, the hydrophobic microlens patterns 81 reflow on the lens seed patterns 71, but do not extend to the surfaces of the inorganic layer 50 exposed by the lens seed patterns 71.

Also, because of the low reflow ratio associated with the microlenses 85 and the inorganic layer 50, even when the reflow process is excessively performed, the microlenses 85 may only minimally invade into the inorganic layer 50, so that the adjacent microlenses 85 are inhibited from merging with each other.

The method of manufacturing the image sensor according to embodiments of the present invention can minimize the gaps between the adjacent microlenses 85 to inhibit a bridge and merging of microlenses, thereby improving the quality of the image sensor.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing an image sensor, comprising:
    forming an inorganic layer on a semiconductor substrate including unit pixels;
    selectively forming lens seed patterns comprising an organic material on the inorganic layer; and
    forming microlenses on the lens seed patterns,
    where the forming of the lens seed pattern comprises:
        forming gap patterns on the inorganic layer;
        forming lens seed layer on the inorganic layer and the gap patterns using a coating process; and
        removing the gap patterns and the lens seed layer on the gap patterns to form the lens seed patterns spaced apart from each other.

2. The method according to claim 1, wherein forming the gap patterns on the inorganic layer comprises performing a photolithography process using a photomask having an opposite pattern to a photomask for the microlenses.

3. The method according to claim 1, wherein forming the lens seed layer on the inorganic layer and the gap patterns comprises coating the lens seed layer to a thickness of about 10 nm to 1,000 nm.

4. The method according to claim 1, further comprising, before the removing of the gap patterns and the lens seed layer on the gap patterns:
    developing the lens seed layer; and
    heat-treating the lens seed layer to cure the lens seed layer.

5. The method according to claim 1, wherein removing the gap patterns and the lens seed layer on the gap patterns comprises using a solvent.

6. The method according to claim 5, wherein the solvent comprises a mixture or propylene glycol monomethyl ether (PGME) and propylene glycol monomethyl ether acetate (PGMEA).

7. The method according to claim 1, wherein the lens seed layer on the gap patterns is simultaneously removed with the gap patterns by the removal of the gap patterns.

8. The method according to claim 1, wherein forming the inorganic layer comprises depositing a hydrophilic oxide layer.

9. The method according to claim 1, wherein the lens seed patterns comprise a thermal resin.

* * * * *